(12) United States Patent
Ryoo et al.

(10) Patent No.: US 7,977,662 B2
(45) Date of Patent: Jul. 12, 2011

(54) PHASE-CHANGEABLE MEMORY DEVICES HAVING REDUCED SUSCEPTIBILITY TO THERMAL INTERFERENCE

(75) Inventors: Kyung-Chang Ryoo, Gyeonggi-do (KR); Jong-Woo Ko, Gyeonggi-do (KR); Yoon-Jong Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 239 days.

(21) Appl. No.: 12/265,262

(22) Filed: Nov. 5, 2008

(65) Prior Publication Data

US 2009/0127538 A1    May 21, 2009

(30) Foreign Application Priority Data

Nov. 15, 2007  (KR) .......................... 10-2007-116666

(51) Int. Cl.
*H01L 29/06*  (2006.01)
*H01L 47/00*  (2006.01)

(52) U.S. Cl. ......... 257/5; 257/2; 257/3; 257/4; 257/311; 257/510; 257/903; 257/E29.141; 257/E29.17; 365/148

(58) Field of Classification Search .................. 257/5, 2, 257/311, E29.141, E29.17, 3, 4, 510, 903; 365/148
See application file for complete search history.

(56) References Cited

U.S. PATENT DOCUMENTS

| | | | |
|---|---|---|---|
| 6,815,704 B1 * | 11/2004 | Chen ................................. | 257/2 |
| 7,029,925 B2 | 4/2006 | Celii et al. | |
| 2006/0110888 A1 | 5/2006 | Cho et al. | |
| 2007/0131980 A1 * | 6/2007 | Lung .............................. | 257/246 |
| 2009/0101883 A1 * | 4/2009 | Lai et al. ............................ | 257/3 |

FOREIGN PATENT DOCUMENTS

| KR | 1020030080843 A | 10/2003 |
|---|---|---|
| KR | 1020050001169 A | 1/2005 |
| KR | 1020060034530 A | 4/2006 |

* cited by examiner

*Primary Examiner* — Matthew E Warren
*Assistant Examiner* — David Z Chen
(74) *Attorney, Agent, or Firm* — Myers, Bigel, Sibley & Sajovec

(57) ABSTRACT

A non-volatile memory array includes an array of phase-changeable memory elements that are electrically insulated from each other by at least a first electrically insulating region extending between the array of phase-changeable memory elements. The first electrically insulating region includes a plurality of voids therein. Each of these voids extends between a corresponding pair of phase-changeable memory cells in the non-volatile memory array and, collectively, the voids form an array of voids in the first electrically insulating region.

7 Claims, 15 Drawing Sheets

PHASE-CHANGEABLE MEMORY DEVICES HAVING REDUCED SUSCEPTIBILITY TO THERMAL INTERFERENCE

REFERENCE TO PRIORITY APPLICATION

This U.S. non-provisional patent application claims priority under 35 U.S.C. §119 to Korean Patent Application No. 10-2007-0116666, filed Nov. 15, 2007, the entire contents of which are hereby incorporated herein by reference.

FIELD OF THE INVENTION

The present invention relates to integrated circuit memory devices and, more particularly, to non-volatile integrated circuit memory devices.

BACKGROUND OF THE INVENTION

The exemplary embodiments disclosed herein relates to a memory device, and more particularly, to a phase-changeable memory device.

A phase-changeable memory device is a type of non-volatile memory device containing a material that is capable of reversibly changing its crystalline state. In terms of structure, this phase-changeable memory device may be similar to a dynamic random access memory (DRAM) and a ferroelectric random access memory (FRAM) in which a dielectric material is interposed between two electrodes. However, the phase-changeable memory device is different from DRAM and FRAM in terms of an information programming method. While a DRAM device utilizes polarization property of a dielectric material and an FRAM device utilizes polarization property of a ferroelectric material, the phase-changeable memory device uses phase-changeable property of a phase-changeable material.

Since a semiconductor device has been being highly integrated until now, the interval between adjacent cells is reduced, thereby deteriorating semiconductor device reliability (e.g., greater interference between adjacent cells).

SUMMARY OF THE INVENTION

Embodiments of the present invention include an integrated circuit memory device having a non-volatile memory array therein. This non-volatile memory array includes an array of phase-changeable memory elements that are electrically insulated from each other by at least a first electrically insulating region extending between the array of phase-changeable memory elements. The first electrically insulating region includes a plurality of voids therein. Each of these voids extends between a corresponding pair of phase-changeable memory cells in the non-volatile memory array and, collectively, the voids form an array of voids in the first electrically insulating region.

According to some of these embodiments of the invention, the non-volatile memory array includes a two-dimensional array of phase-changeable memory elements having a plurality of rows and columns of phase-changeable memory elements therein. Likewise, the array of voids may be a two-dimensional array of voids, with each void in the two-dimensional array of voids extending between two phase-changeable memory elements in the same row or between two phase-changeable memory elements in the same column. The plurality of voids in the array may also intersect with each other to thereby define a ring-shaped void surrounding a phase-changeable memory element. Or, alternatively, the plurality of voids in the array may intersect with each other to thereby define a stripe-shaped void extending between a plurality of phase-changeable memory elements (e.g., extending between a row or column of memory elements).

The at least a first electrically insulating region may include a silicon nitride layer covering the array of phase-changeable memory elements and a silicon oxide layer on the silicon nitride layer. The silicon nitride layer may have an undulating surface profile with peaks and valleys thereon, and the silicon oxide layer may extend into the valleys in the undulating surface profile and include the array of voids therein. In particular, each of a plurality of voids in the array may be self-aligned to a valley in the undulating surface profile. The voids may be positioned so that a horizontal plane intersecting the array of phase-changeable memory elements extends through a plurality of voids in the array of voids.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
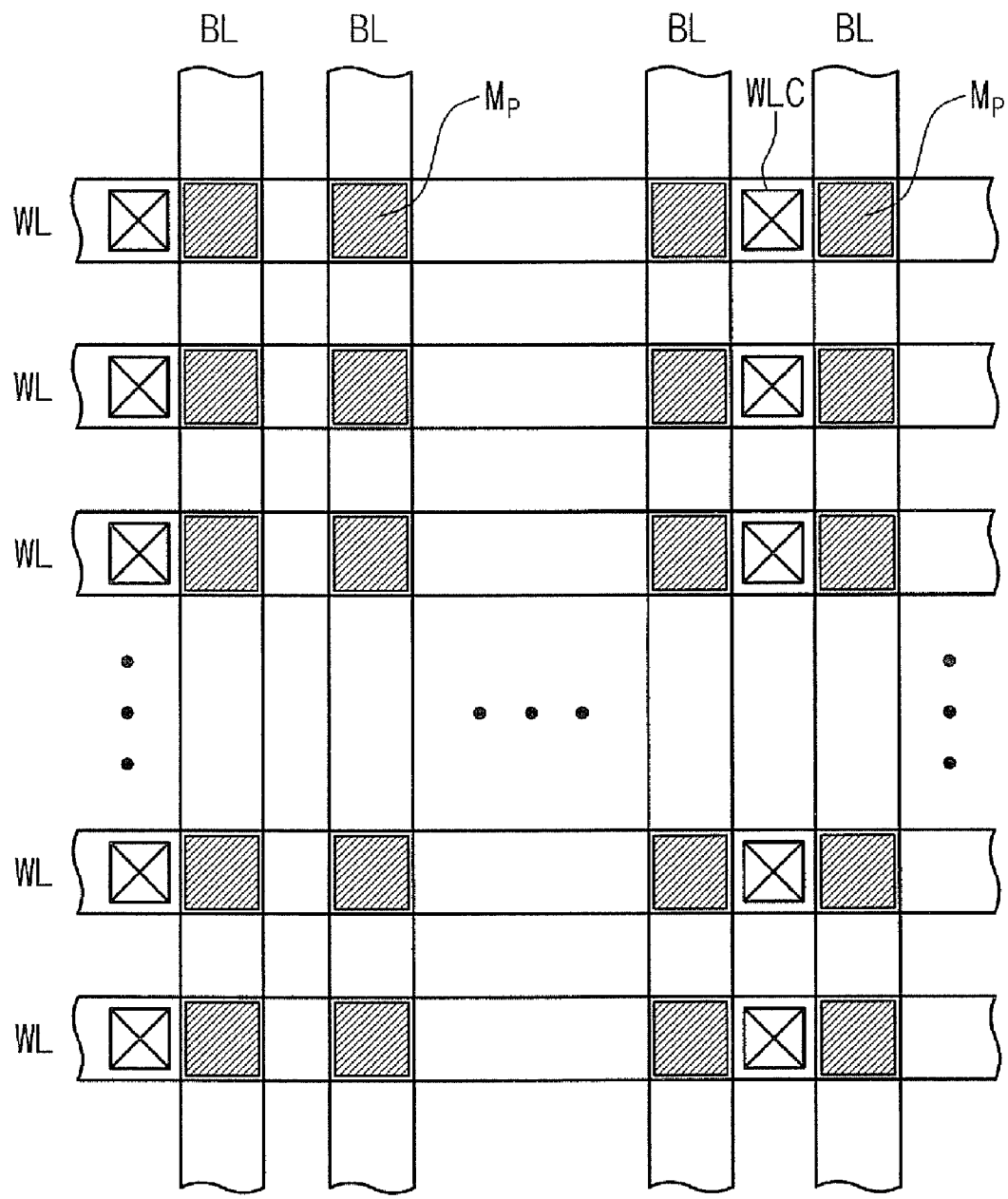
FIG. 1 is a plan view illustrating a portion of a memory cell array region according to one embodiment of the present invention.

Hereinafter, embodiments of the present invention will be described in more detail with reference to the accompanying drawings. The objective(s), feature(s), and advantage(s) of the present invention will be thoroughly and easily understood with reference to the embodiments below and the accompanying drawings. The embodiments of the present invention may, however, be embodied in different forms and should not be construed as being limited to the embodiments set forth herein. Rather, these embodiments are provided so that this disclosure will be thorough and complete, and will fully convey the scope of the present invention to those skilled in the art. Like reference numerals refer to like elements throughout.

In the specification, 'a substrate' or 'a semiconductor substrate', or 'a semiconductor layer' may indicate an arbitrary semiconductor based structure having a silicon surface. Also, it may indicate an arbitrary conductive region and/or a semiconductor based structure having an insulation region. This kind of a semiconductor based structure may also include silicon, a silicon-on-insulator(SOI), silicon-germanium (SiGe), germanium(Ge), gallium-arsenide(GaAs), doped or undoped silicon, a silicon epitaxial layer supported by a semiconductor structure, or other arbitrary semiconductor structures.

In the specification, it will be understood that when a conductive layer, a semiconductor layer, or an insulation layer is referred to as being 'on' another layer or substrate, it can be directly on the another layer or substrate, or intervening layers may also be present. Also, though terms like a first, a second, and a third are used to describe various regions and layers in different embodiments of the present invention, the regions and the layers are not limited to these terms.

Terms used in the specification such as 'a metal thin layer' or 'conductor' include a conductive metal nitride, a conductive metal oxide, a conductive oxide nitride, a silicide, a metal compound, or combinations thereof. The metal, for example, includes aluminum(Al), copper(Cu), titanium tungsten (TiW), tantalum(Ta), molybdenum(Mo), tungsten(W) but is not limited thereto. The conductive metal nitride, for example, includes titanium nitride(TiN), tantalum nitride (TaN), molybdenum nitride(MoN), niobium nitride(NbN), titanium silicon nitride(TiSiN), titanium aluminum nitride (TiAlN), titanium boron nitride(TiBN), zirconium silicon nitride(ZrSiN), tungsten silicon nitride(WSiN), tungsten boron nitride(WBN), zirconium aluminum nitride(ZrAlN), molybdenum silicon nitride(MoSiN), molybdenum aluminum nitride(MoAlN), tantalum silicon nitride(TaSiN), and tantalum aluminum nitride(TaAlN), but is not limited thereto. The conductive metal oxide may include a conductive noble metal oxide such as iridium oxide(IrO) and ruthenium oxide (RuO), but is not limited thereto.

Some embodiments of the present invention provide a phase-changeable memory device. The phase-changeable memory device may include a phase-changeable memory element. The phase-changeable memory element according to the embodiments of the present invention may include a phase-changeable material. The phase-changeable material may include a chalcogen compound. The phase-changeable material may be indicated as AB. The 'A' includes at least one tellurium(Te), selenium(Se), sulfur(S), and polorium(Po). The 'B' includes at least of antimony(Sb), arsenic(As), germanium(Ge), tin(Sn), phosphorous(P), oxygen(O), indium (In), bismuth(Bi), silver(Ag), gold(Au), palladium(Pd), titanium(Ti), boron(B), nitrogen(N), and silicon(Si).

The phase-changeable material may include a chalcogen compound (such as Ge—Sb—Te(GST), Ge—Bi—Te(GBT), As—Sb—Te, As—Ge—Sb—Te, Sn—Sb—Te, Ag—In—Sb—Te, 5A group element-Sb—Te, 6A group element-Sb—Te, 5A group element-Sb—Se, and 6A group element-Sb—Se), or a chalcogen compound having impurity doped with the above listed chalcogen compound. The impurity doped in the chalcogen compound may include nitrogen, oxygen, silicon, or a combination thereof.

FIG. 1 is a plan view illustrating a portion of a memory cell array region according to one embodiment of the present invention. Referring to FIG. 1, the memory cell array region includes a plurality of bit lines BL, a plurality of word lines WL, and a memory cell defined at an intersection area of the word line WL and the bit line BL. A memory cell may include a phase-changeable memory element $M_p$. This phase-changeable memory element $M_p$ is a material in which its crystalline state may be reversibly changed by an applied signal (e.g., an electric signal of a voltage or current, an optical signal, or radiation). For example, the phase-changeable memory element $M_p$ may include a phase-changeable material such as a chalcogen compound. To reduce resistance of the word line WL, a low resistance metal line may be electrically connected to each word line WL through a word line contact WLC. Phase-changeable memory elements arranged in a column direction may be connected to each other.

Figure 2:
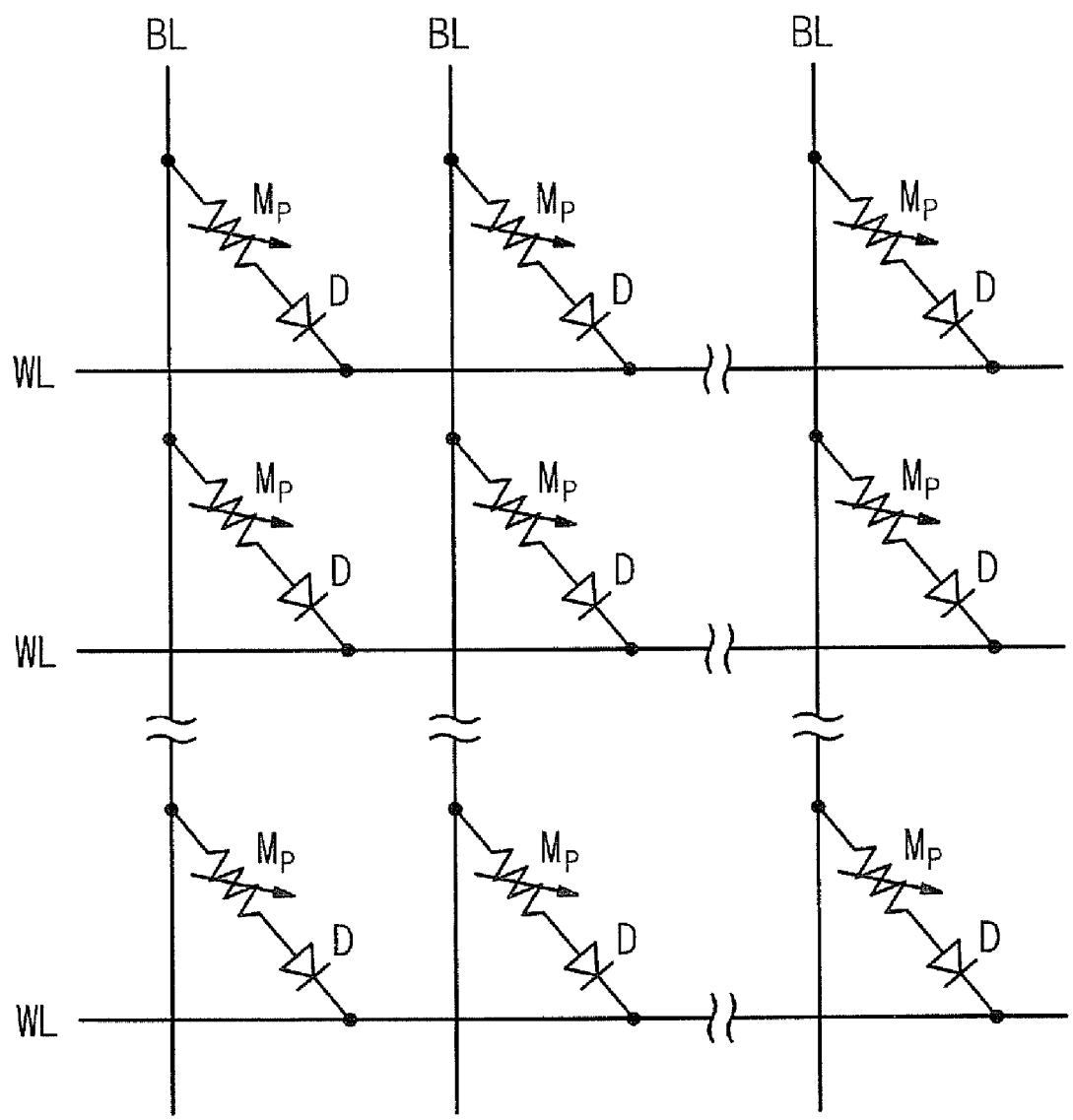
FIG. 2 is an equivalent circuit diagram illustrating a portion of a cell array region of a phase-changeable memory device according to one embodiment of the present invention.

FIG. 2 is an equivalent circuit diagram illustrating a portion of a cell array region of a phase-changeable memory device according to one embodiment of the present invention. Referring to FIG. 2, one end of a phase-changeable memory element $M_p$ is connected to a bit line BL, and the other end is connected to a word line WL through a selection device. A diode, a MOS transistor, or a MOS diode may be used as a selection device for selecting the phase-changeable memory element $M_p$, but the selection device is not limited thereto. The diode D is illustrated as one example of the selection device in FIG. 2.

Figure 3:
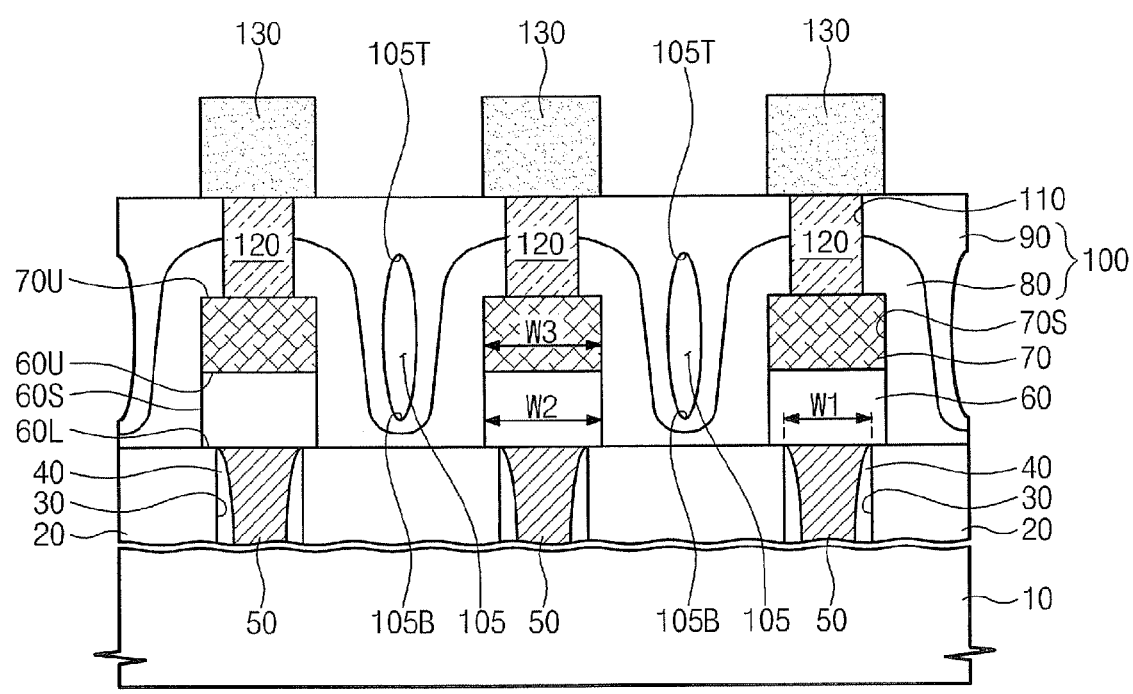
FIG. 3 is a cross-sectional view of a phase-changeable memory device according to one embodiment of the present invention.
Figure 4:
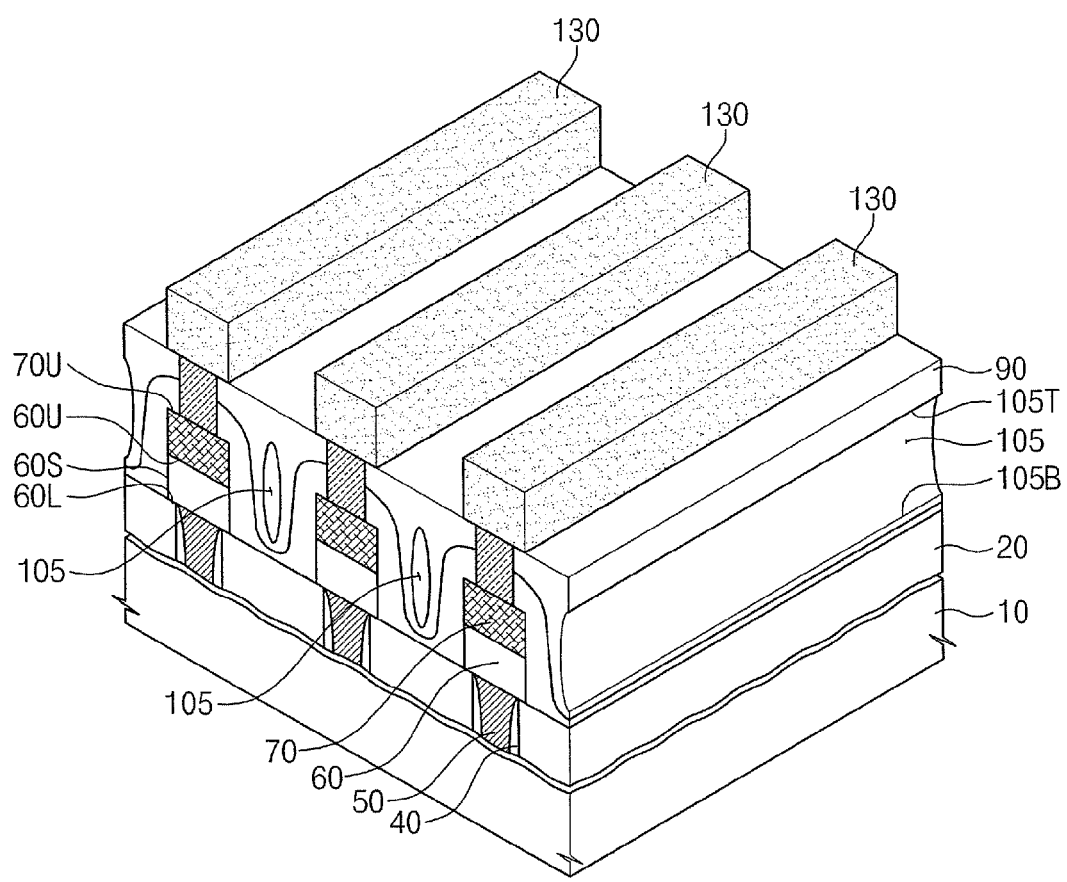
FIG. 4 is a perspective view of a phase-changeable memory device according to one embodiment of the present invention.

FIG. 3 is a cross-sectional view of a phase-changeable memory device according to one embodiment. FIG. 4 is a perspective view of a phase-changeable memory device according to one embodiment. The phase-changeable memory device includes a phase-changeable memory element 60. The phase-changeable memory element 60 may include a phase-changeable material. The phase-changeable memory element 60 may include an upper surface 60U, a lower surface 60L, and a side surface 60S. The lower surface 60L is a surface that is relatively close to a substrate 10 and the upper surface 60U is a surface that is relatively far from the substrate 10.

A first electrode 50 is connected to the lower surface 60L of the phase-changeable memory element 60 and a second electrode 70 is connected to the upper surface 60U of the phase-changeable memory element 60. Hereinafter, since the first electrode 50 is close to the substrate 10, it may be called a lower electrode, and since the second electrode 70 is far from the substrate 10 than the first electrode 50, it may be called an upper electrode.

Insulation layers 20 and 100 surround a phase-changeable memory cell. For convenience of explanation, an insulation layer surrounding the lower electrode 50 may be called the lower insulation layer 20, and an insulation layer surrounding the phase-changeable memory element 60 and the upper electrode 70 may be called the upper insulation layer 100. The lower electrode 50 may be provided in a plug type penetrating the lower insulation layer 20, for example. That is, the lower electrode 50 may be provided in a contact hole 30 penetrating the lower insulation layer 20. A spacer 40 may be further provided on the sidewall of the contact hole 30. A spacer 40 may reduce the diameter of the lower electrode 50 having a plug form.

The width W1 of the lower electrode 50 may be narrower than the width W2 of the phase-changeable memory element 60 and the width W3 of the upper electrode 70. The widths of the lower electrode 50, the phase-changeable memory element 60, and the upper electrode 70 may refer to a length along a word line direction or a bit line direction. For example, the lower surface 60L of the phase-changeable memory element 60 may completely cover the upper of the lower electrode 50 and may simultaneously cover a portion of the lower insulation layer 20 outside the lower electrode 50.

According to one embodiment of the present invention, the upper insulation layer 100 may have a void 105 therein. The void 105 may be provided between adjacent phase-changeable memory elements 60. This void 105 may serve as to prevent or minimize thermal interference between adjacent phase-changeable memory cells 60. For example, the bottom 105B of the void 105 may be higher than the lower surface 60L of the phase-changeable memory element 60, and the top 105T of the void 105 may be higher than the upper surface 60U of the phase-changeable memory element 60. The positions of the bottom 105B and the top 105T, and the shape and size of the void 105 may vary based on the distance between adjacent phase-changeable memory elements, the thickness of the phase-changeable memory element 60 and the upper electrode 70, and materials and formation methods of the upper insulation layer 100. For example, the void 105 has the position, shape, and size as illustrated in FIG. 3, but may not be limited thereto. That is, the void 105 may have the various positions, forms and sizes according to the arrangement and/or form of the phase-changeable memory element 60. For example, the void 105 may be limited to the side surface 60S of the phase-changeable memory element 60. Moreover, the void 105 may be limited to the side surface 60S of the phase-changeable memory element 60 and the side surface 70S of the upper electrode 70.

For example, the void 105 may be configured to have one or combinations of the following features.

(1) the bottom 105B of the void 105 may be higher than the lower surface 60L of the phase-changeable memory element 60.

(2) the bottom 105B of the void 105 may be lower than the upper surface 60U of the phase-changeable memory element 60.

(3) the top 105T of the void 105 may be higher than the upper surface 60U of the phase-changeable memory element 60.

(4) the top 105T of the void 105 may be higher than the upper surface 70U of the upper electrode 70.

(5) the bottom 105B of the void 105 may be disposed between the upper surface 60U of the phase-changeable memory element 60 and the upper surface 70U of the upper electrode 70.

(6) the top 105T of the void 105 may be disposed between the bottom surface 60L and the top surface 60U of the phase-changeable memory element 60.

In one embodiment of the present invention, the upper insulation layer 100 may include a first insulation layer 80 adjacent to the phase-changeable memory element 60 and the upper electrode 70 and a second insulation layer 90 including the void 105.

The first insulation layer 80 may be a material having a lower thermal conductivity than the second insulation layer 90. For example, the first insulation layer 80 may include silicon nitride (SiN) and the second insulation layer 90 may include a silicon oxide (SiO).

According to embodiments of the present invention, a phase-changeable memory cell (e.g., the side of a phase-changeable memory element and/or the side of an upper electrode) may be surrounded by a void. That is, voids are provided between adjacent phase-changeable memory cells, for example, adjacent phase-changeable memory elements and/or adjacent upper electrodes. This void has an excellent thermal insulation property because its thermal conductivity is lower than insulation materials, for example, silicon oxide or silicon nitride, which are typically formed during a semiconductor manufacturing process. That is, according to embodiments of the present invention, thermal isolation property between adjacent phase-changeable memory cells can be improved because of the void. Accordingly, even if the distance between adjacent phase-changeable memory cells becomes shorter while a semiconductor device is highly integrated, changes in a resistance state (information stored in an adjacent phase-changeable memory cell) of an unselected adjacent phase-changeable memory cell can be minimized or prevented substantially. The reason is that a heat provided to a memory element of a phase-changeable memory cell selected for programming a phase-changeable memory cell into a SET state or a RESET state can be prevented from transferring into an adjacent phase-changeable memory cell or minimized substantially.

According to embodiments of the present invention, since the void surrounds the phase-changeable memory cell, an amount of oxygen surrounding a memory cell can be reduced, and accordingly, oxidation of the interface between the lower electrode and the phase-changeable memory element can be prevented or minimized. If the interface between the lower electrode and the memory element is oxidized up to an unallowable limit, a SET resistance is especially increased such that a sensing margin for distinguishing a SET state from a RESET state can be reduced.

In the phase-changeable memory device according to one embodiment of the present invention, the shapes of the phase-changeable memory element and the upper electrode, or the position of the void may vary and will be described with reference to FIGS. 5 through 8.

Figure 5:
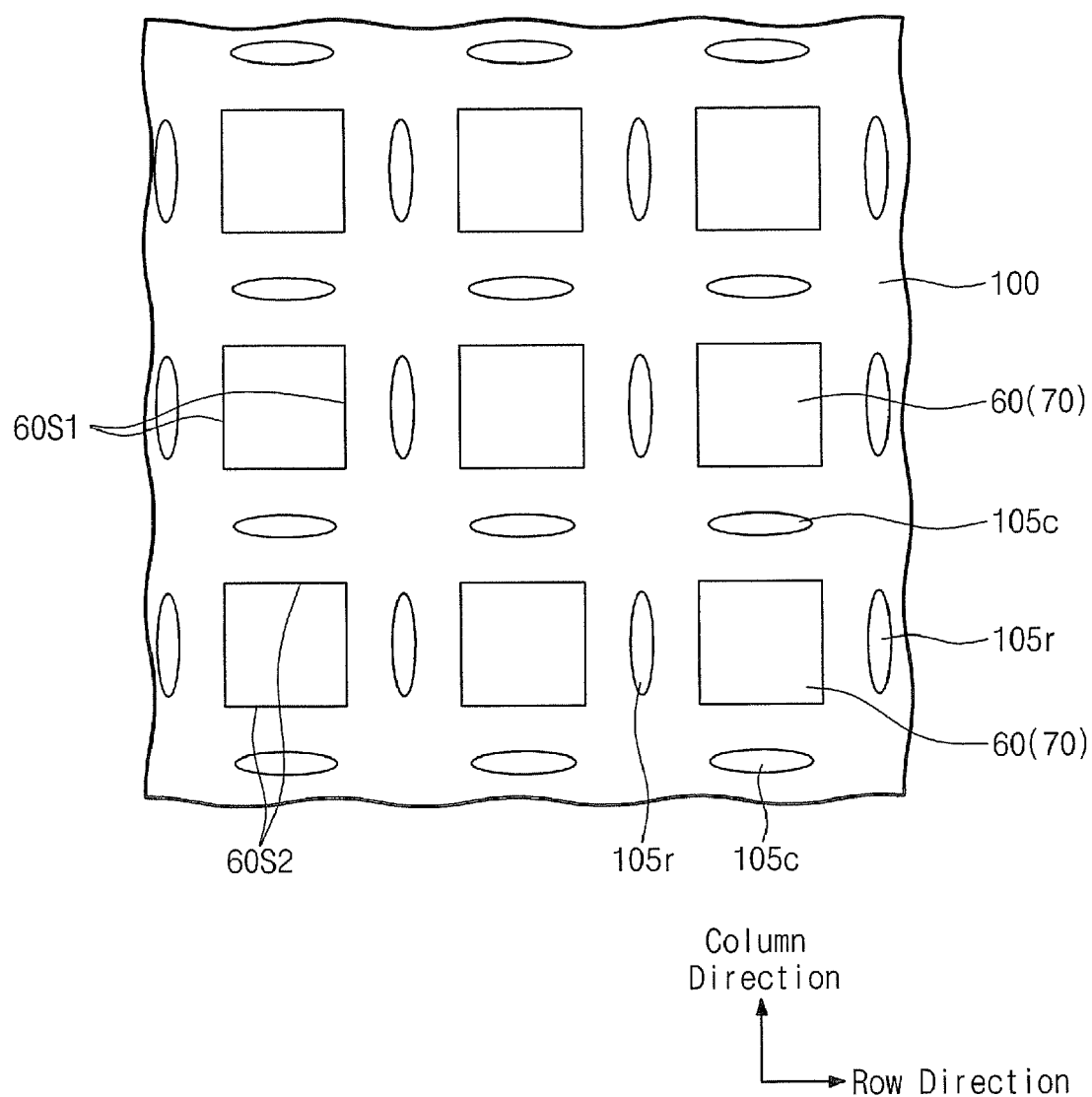
FIGS. 5 through 8 are plan views of phase-changeable memory elements and voids according to embodiments of the present invention.

Referring to FIG. 5, there is provided a plurality of phase-changeable memory elements 60 disposed in a row direction and a column direction. For example, the phase-changeable memory element 60 may include four sides. The sides (first two opposite sides) 60S1 in one pair face one another along a row direction, and the sides (second two opposite sides) in another pair face one another along a column direction. The upper electrode 70 may be provided on the upper of the corresponding phase-changeable memory element 60. According to embodiments of the present invention, a first void 105r may be provided between adjacent phase-changeable memory elements 60 in a row direction. That is, two first voids 105r may be provided adjacent to the first two opposite sides 60S1 of the phase-changeable memory element 60. Additionally, a second void 105c may be provided between adjacent phase-changeable memory elements 60 in a column direction. That is, two second voids 105c may be provided adjacent to the second two opposite sides 60S2 of the phase-changeable memory element 60. According to embodiments of the present invention, four voids are provided adjacent to the sides of the phase-changeable memory element 60 and/or the upper electrode 70.

Figure 6:
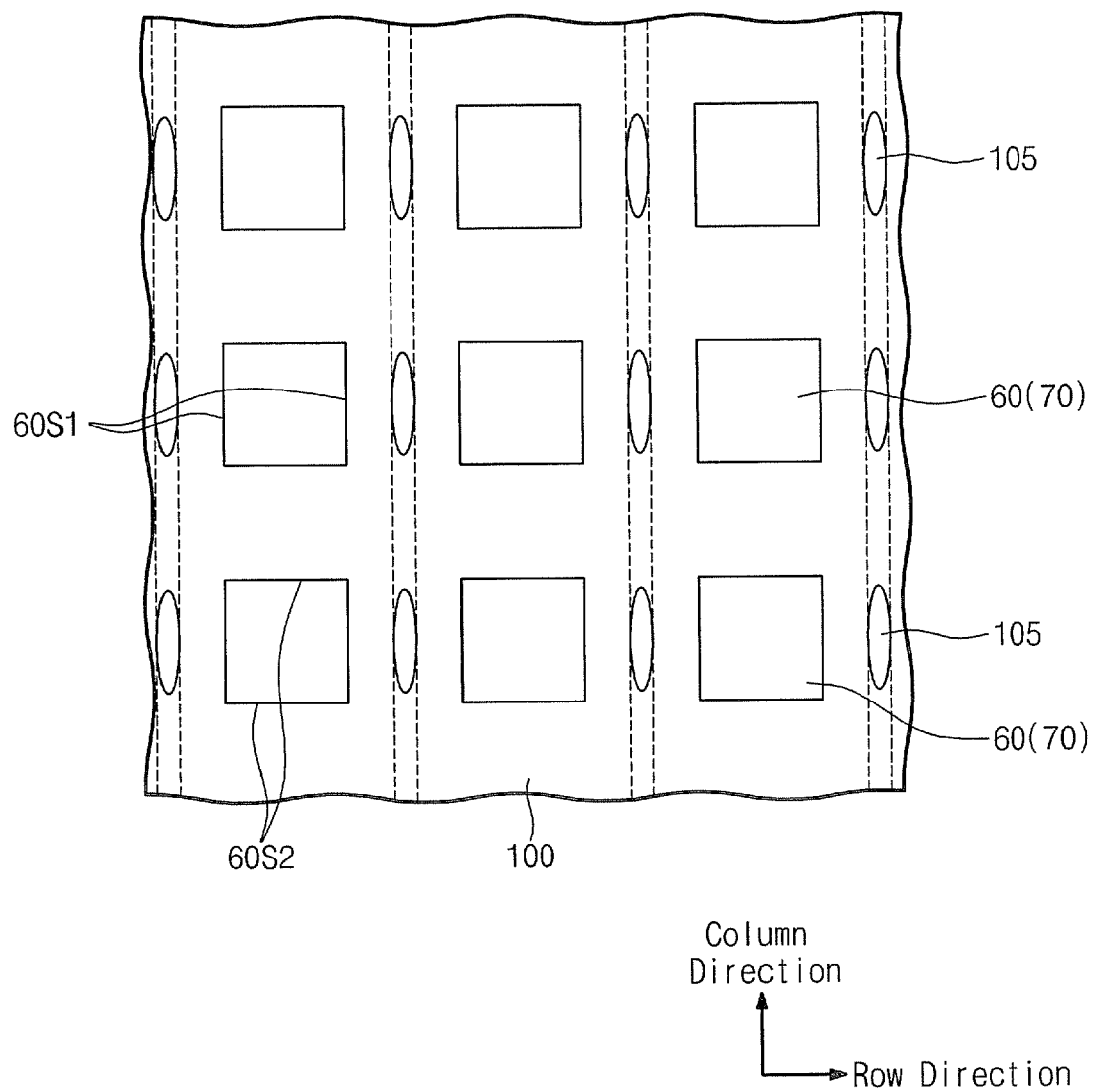

Referring to FIG. 6, voids 105 may be provided adjacent to the first two opposite sides 60S 1 of the phase-changeable memory element 60, and therefore, two voids 105 may be adjacent to the sides of the phase-changeable memory element 60. Moreover, voids may be provided adjacent to the second two opposite sides 60S2 instead of the first both sides of the phase-changeable memory element 60.

Figure 7:
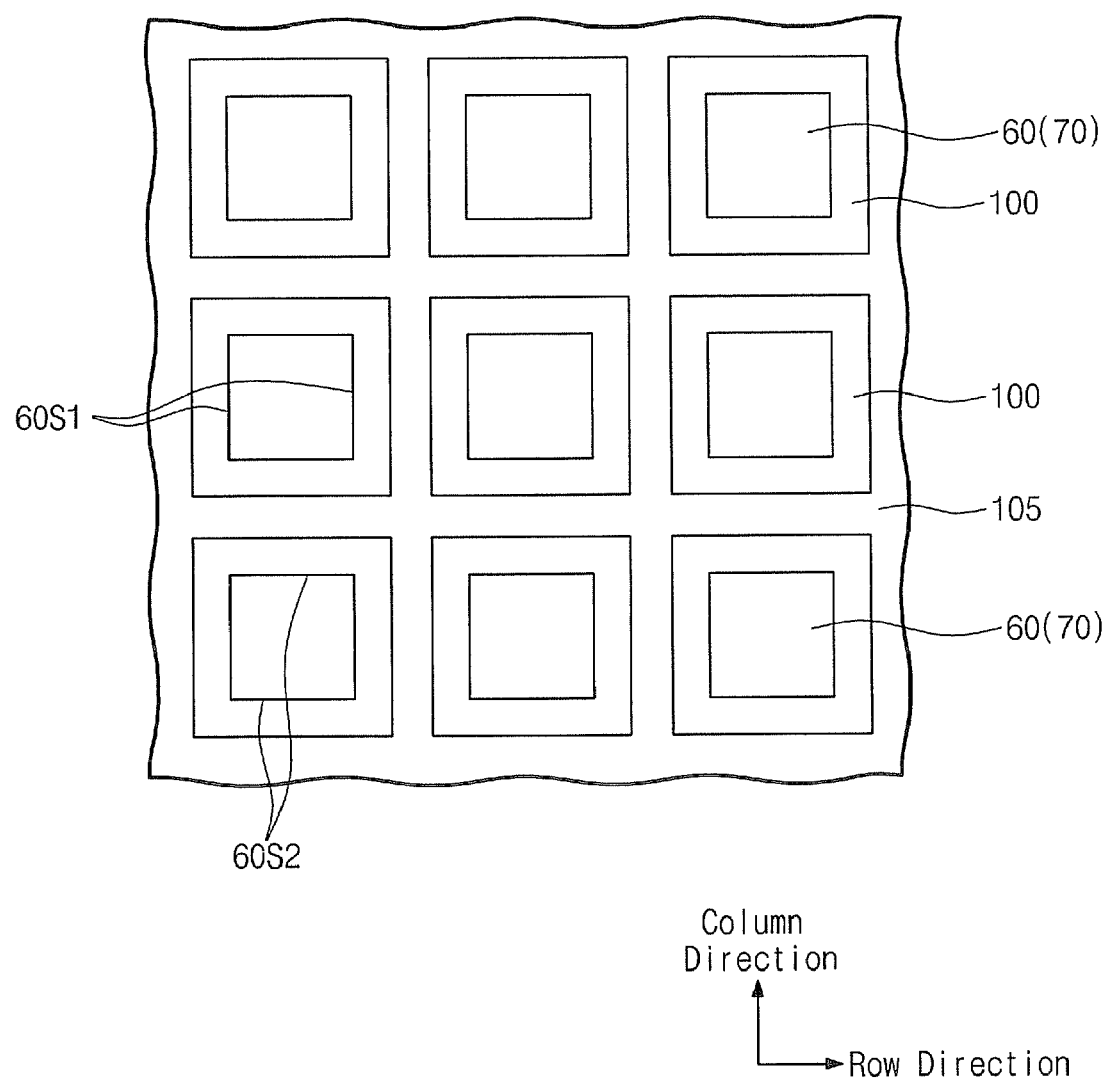

Referring to FIG. 7, four voids 105r and 105c of FIG. 5 are connected to each other to completely cover the sides of the phase-changeable memory element 60.

Figure 8:
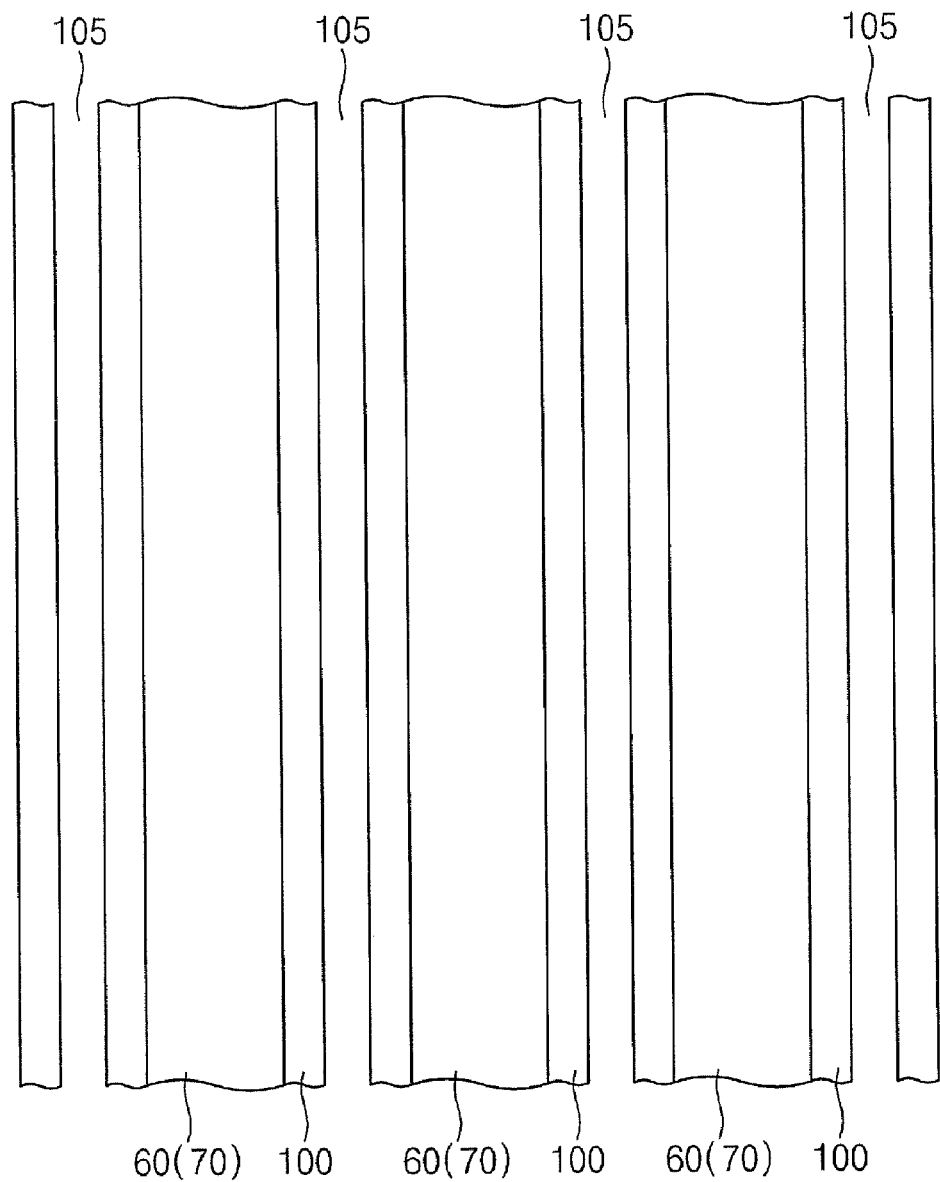

Referring to FIG. 8, the phase-changeable memory elements 60 of adjacent phase-changeable memory cells in a column direction may be connected to each other. For example, the phase-changeable memory element 60 may have a line type extending in a column direction. Likewise, the upper electrode 70 may also have a line type extending in the column direction. According to embodiments of the present invention, the voids 105 may be provided between the adjacent line-form phase-changeable memory elements 60 in the column direction and/or between the adjacent line form upper electrode 70 in the column direction.

According to one embodiment of the present invention, adjacent phase-changeable memory elements in a row direction may be connected to each other such that phase-changeable memory elements of a line form extending in a row direction can be provided.

According to one embodiment of the present invention, a bit line extends in a column direction and a word line extends in a row direction, or vice versa. Additionally, a bit line and/or word line may extend at a predetermined angle offset from a row direction or a column direction. Furthermore, a word line may be formed in a zigzag form with respect to a row direction. Likewise, when a word line is formed at a predetermined angle offset from a row direction or in a zigzag form, the distance between adjacent phase-changeable memory elements connected to the same word line may be increased.

Figure 9:
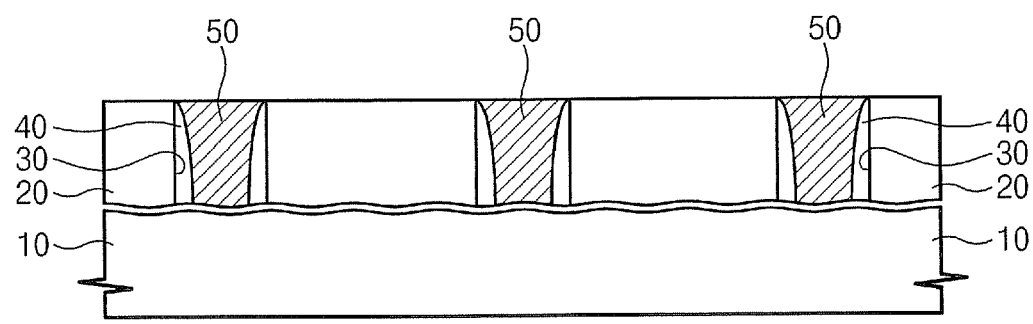
FIGS. 9 through 12 are cross-sectional views illustrating a method of fabricating a phase-changeable memory device according to one embodiment of the present invention.

Hereinafter, a method of fabricating a phase-changeable memory device according to embodiments of the present invention will be described with reference to FIGS. 9 through 12. Referring to FIG. 9, a lower insulation layer 20 is formed on a substrate 10 where a word line and a selection device are formed. A contact hole 30 for a lower electrode is formed by patterning the lower insulation layer 20. A plug-type lower electrode 50 is formed by filling the contact hole 30 for a lower electrode with a metallic thin layer. Before forming the lower electrode 50, an insulation spacer 40 may be further formed on the sidewall of the contact hole 30. Due to this insulation spacer 40, the diameter of the contact hole 30 can be reduced and accordingly, the width of the lower electrode 50 may become narrower.

The first electrode 50 may include one selected from titanium nitride(TiN), titanium aluminum nitride(TiAlN), tantalum, nitride(TaN), tungsten nitride(WN), molybdenum nitride(MoN), niobium nitride(NbN), titanium silicon nitride (TiSiN), titanium boron nitride(TiBN), zirconium silicon nitride(ZrSiN), tungsten silicon nitride(WSiN), tungsten boron nitride(WBN), zirconium aluminum nitride(ZrAlN), molybdenum aluminum nitride(MoAlN), tantalum silicon nitride(TaSiN), tantalum aluminum nitride(TaAlN), titanium tungsten(TiW), titanium aluminum(TiAl), titanium oxide nitride(TiON), titanium aluminum oxide nitride(TiAlON), tungsten oxide nitride(WON), tantalum oxide nitride(TaON), and a combination thereof.

Figure 10:
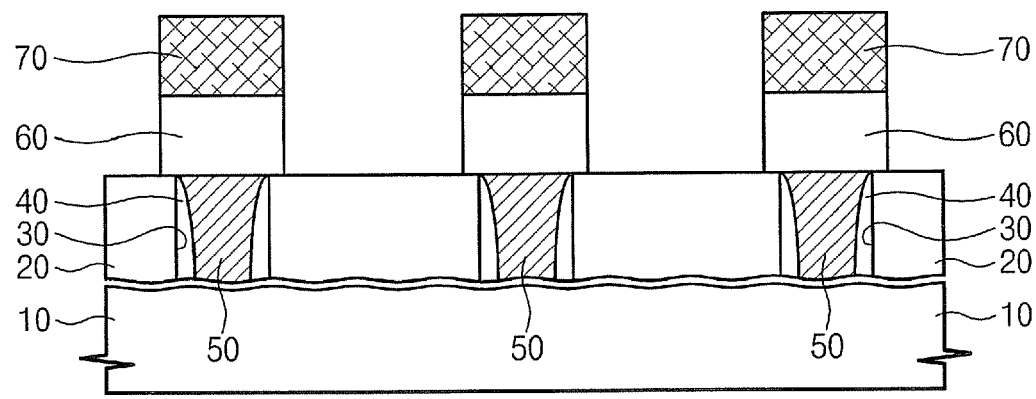

Referring to FIG. 10, a phase-changeable material layer for phase-changeable memory elements and a metallic thin layer for an upper insulation layer are formed on the lower insulation layer 20 and the lower electrode 50. A phase-changeable memory element 60 and an upper electrode 70 are formed by patterning the phase-changeable material layer and the metallic thin layer. If the metallic thin layer and the phase-changeable material layer are etched by using an appropriate mask, the above-mentioned various forms, arrangements, sizes of memory elements and upper electrodes may be formed.

The second electrode 50 may include one selected from titanium nitride(TiN), tantalum nitride(TaN), molybdenum nitride(MoN), niobium nitride(NbN), titanium silicon nitride (TiSiN), titanium aluminum nitride(TiAlN), titanium boron nitride(TiBN), zirconium silicon nitride(ZrSiN), tungsten silicon nitride(WSiN), tungsten boron nitride(WBN), zirconium aluminum nitride(ZrAlN), molybdenum silicon nitride (MoSiN), molybdenum aluminum nitride(MoAlN), tantalum silicon nitride(TaSiN), tantalum aluminum nitride(TaAlN), titanium oxide nitride(TiON), titanium aluminum oxide nitride(TiAlON), tungsten oxide nitride(WON), tantalum oxide nitride(TaON), titanium(Ti), tungsten(W), molybdenum(Mo), tantalum(Ta), titanium silicide(TiSi), tantalum silicide(TaSi), graphite, and a combination thereof.

Figure 11:
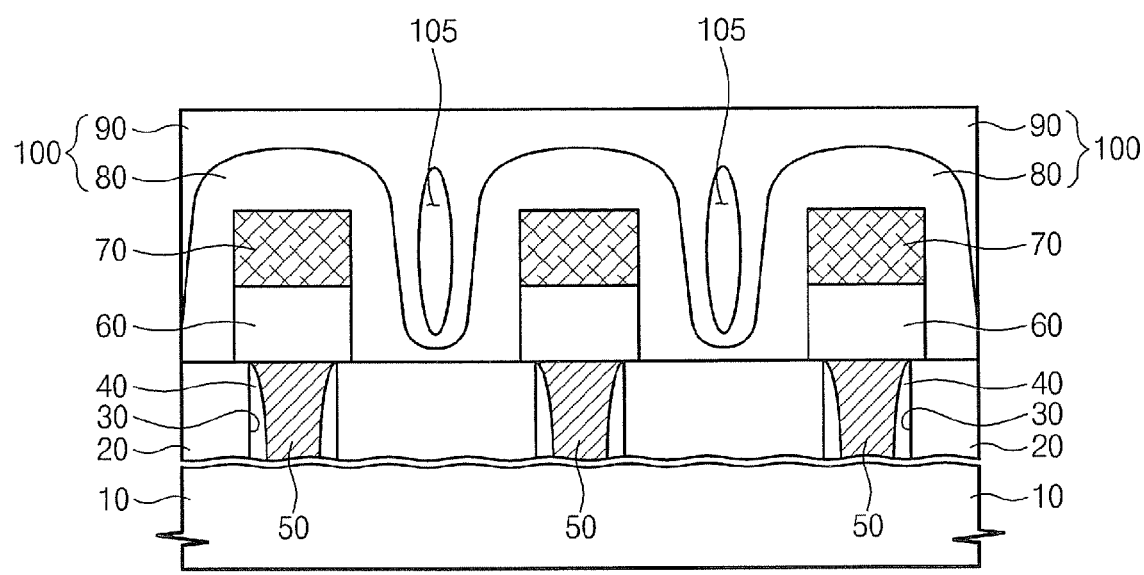

Referring to FIG. 11, an upper insulation layer 100 having a void 105 is formed adjacent the phase-changeable memory element 60 and the upper electrode 70. For example, a first insulation layer 80 (e.g., silicon nitride) is first formed on the lower insulation layer 20, the phase-changeable memory element 60, and the upper electrode 70 in order to prevent oxidation of the phase-changeable memory element 60 and the upper electrode 70. Next, a second insulation layer 90 (e.g., silicon oxide) is formed with a poor step coverage such that the void 105 is formed between adjacent phase-changeable memory elements 60. The second insulation layer 90 may be formed of a tetra ethyl ortho silicate (TEOS) oxide layer or a high density plasma (HDP) oxide layer.

Figure 12:
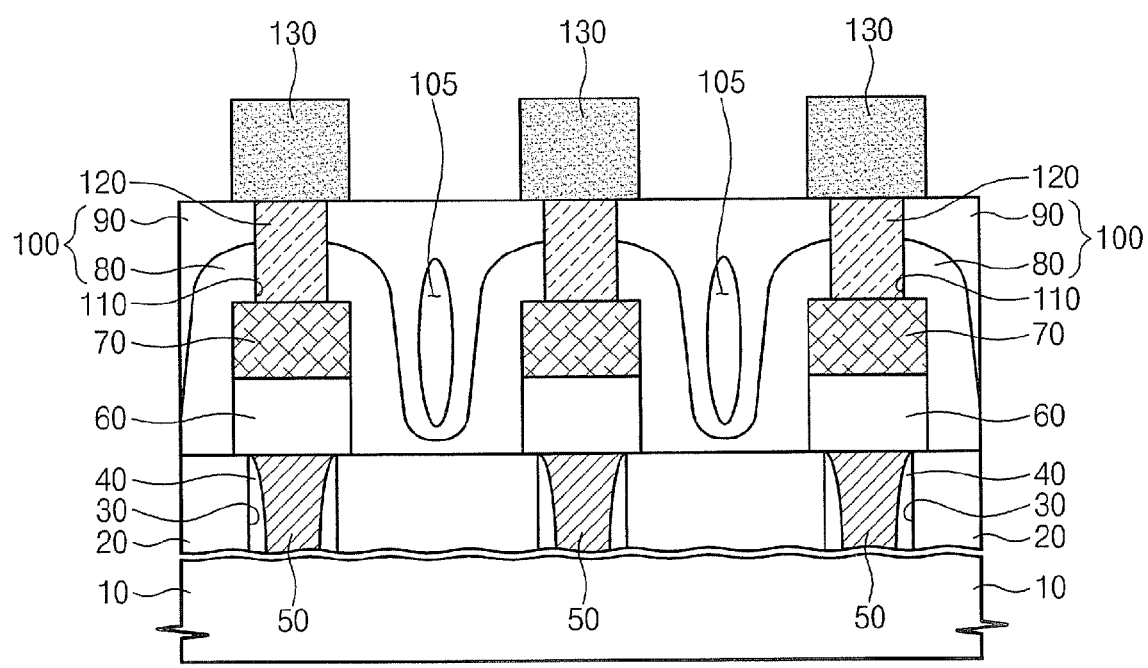

Referring to FIG. 12, a contact hole 110 is formed to expose the upper electrode 70 by patterning the second insulation layer 90 and the first insulation layer 80. After forming a metallic thin layer on the upper insulation layer 100 to fill the contact hole 110, a planarization process is performed to form an upper electrode contact 120 defined to the contact hole 110. Next, after forming a metallic thin layer for a bit line on the upper electrode contact 120 and the upper insulation layer 100, a patterning process is performed to form a bit line 130 that is electrically connected to the upper electrode contact 120. The upper electrode contact 120 and the bit line 130 may be formed using a patterning process once.

Figure 13:
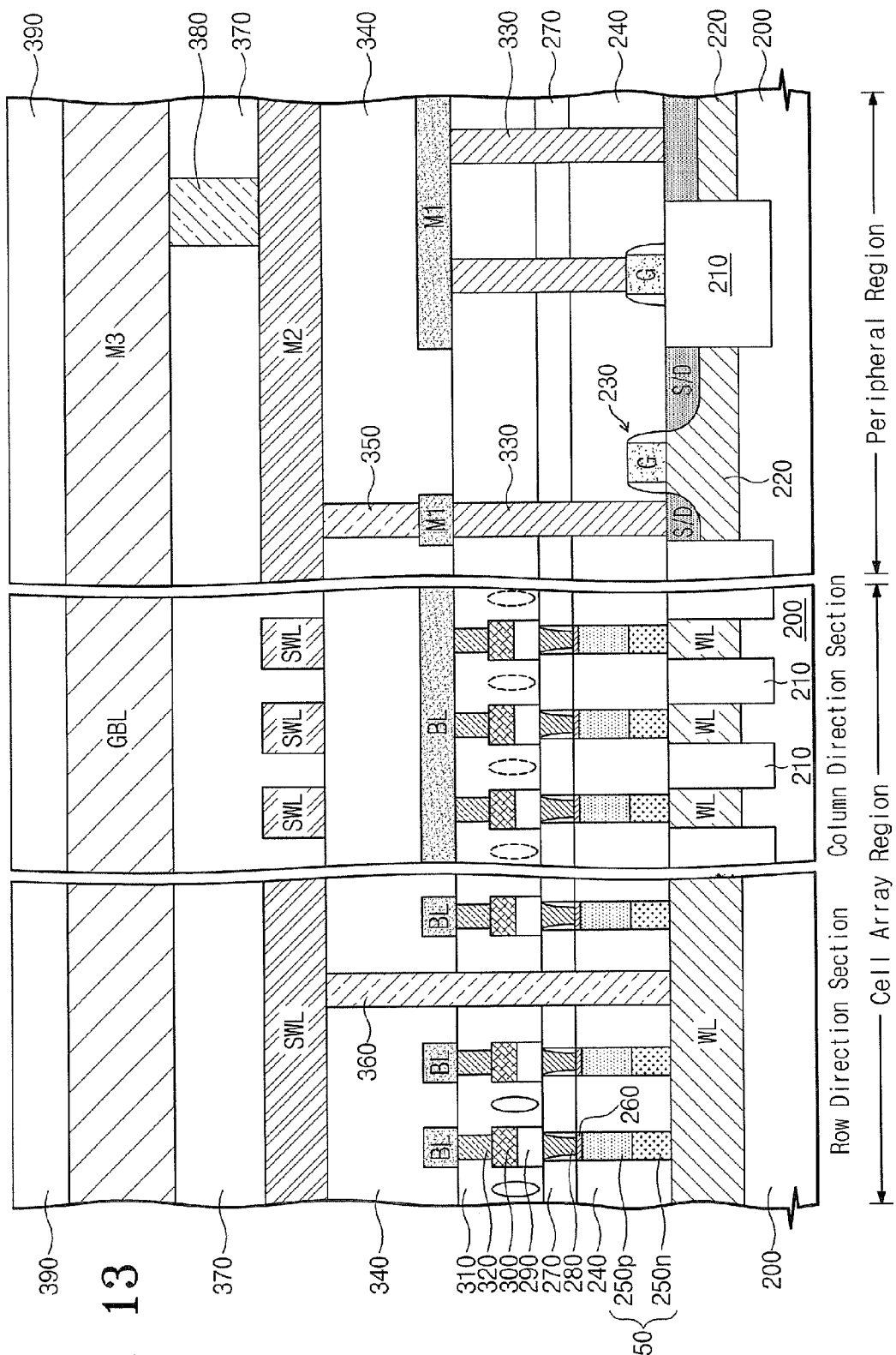
FIG. 13 is a cross-sectional view of a phase-changeable memory device according to one embodiment of the present invention.

FIG. 13 is a cross-sectional view of a phase-changeable memory device according to one embodiment of the present invention and shows sections of a memory cell array region and a peripheral circuit region. In order to thoroughly understand the phase-changeable memory device, all the cross-sections of a memory cell region are illustrated in row and column directions. The left part of FIG. 13 is the cross-section in the row direction, the center part of FIG. 13 is the cross-section in the column direction, and the right part of FIG. 13 is the cross-section of a peripheral circuit region.

Referring to FIG. 13, a plurality of word lines WL is provided on a semiconductor substrate 200 of the memory cell array region. The word lines WL may be formed by doping a semiconductor layer with an n-type impurity, for example. Adjacent word lines WL may be electrically insulated from each other through an insulation layer such as a device insulation layer 210. A driving device (e.g., a driving transistor 230) may be provided in the peripheral circuit region in order to drive the memory cell array region on the active region 220 defined by the device isolation layer 210. A plurality of bit lines BL is provided on the substrate 200 of the memory cell array region to cross over the word lines WL. A first metal interconnection M1 corresponding to the bit line BL is provided in the peripheral circuit region. The first metal interconnection M1 may be electrically connected to a gate G or a source/drain region S/D of the driving transistor 220. The bit line BL and the first metal interconnection M1 may be formed of a metallic thin layer.

The word line WL may be provided in or on the substrate 200, and may be a semiconductor layer doped with an n-type impurity, for example. If the word line WL is formed of a semiconductor layer, a semiconductor layer for this word line may be formed by doping a predetermined region of the substrate 200 with an impurity, doping an epitaxial semiconductor layer with an impurity after forming the epitaxial semiconductor layer, or simultaneously doping an epitaxial semiconductor layer with an impurity when forming the epitaxial semiconductor layer. Additionally, the word line WL may be formed of a metallic thin layer.

On the other hand, in the peripheral circuit region, the first interconnection M1 is electrically connected to the driving device (i.e., the gate G and the source/drain S/D of the driving transistor 230) through the contact plug 330.

A phase-changeable memory element 290 is disposed between the word line WL and the bit line BL.

A first electrode 280 and a selection device 250 are provided between the phase-changeable element 290 and the word line WL. A second electrode 300 is provided between the phase-changeable memory element 290 and the bit line BL. That is, the first electrode 280 and the second electrode 300 are electrically connected to the phase-changeable memory element 290. For example, the first electrode 280 may be electrically connected to the word line WL through a selection device such as a diode 250. The second electrode 300 is electrically connected to the bit line BL.

The diode 250 (i.e., the selection device) may include an n-type semiconductor 250n and a p-type semiconductor 250p, which are stacked on the substrate 20Q. The p-type semiconductor layer 250p may be adjacent to the first electrode 280, and the n-type semiconductor 250n may be adjacent to the word line WL. To reduce a contact resistance between the diode 250 and the first electrode 280, a silicide layer 260 may be provided. The silicide layer 260 may include a metal silicide such as cobalt silicide, nickel silicide, or titanium silicide.

A low resistance metal interconnection (hereinafter, referred to as a strapping word line SWL) that is electrically connected to the word line WL through the word line contact 360 is provided on the bit line BL of the memory cell array region. This strapping word line SWL reduces a resistance of the word line WL. The word line contact 360 may be formed by each predetermined memory cell, and may be formed by adjacent eight memory cells, for example. That is, eight memory cells may be provided between the adjacent word line contacts 360. Moreover, the word line contact 360 may be irregularly formed by various memory cells. That is, the various number of memory cells (e.g., 16, 32) may be provided between adjacent word line contacts 360. On the other hand, a second metal interconnection M2 corresponding to the strapping word line SWL is provided on the first metal interconnection M1 of the peripheral region. The strapping word line SWL and the second metal interconnection M2 may be formed of a metallic thin layer. The second metal interconnection M2 may be electrically connected to the first metal interconnection M1 through a via contact 350.

A global bit line GBL is provided on the strapping word line SWL and a third metal interconnection M3 corresponding to the global bit line GBL is provided on the second metal interconnection M2. This global bit line GBL and the third metal interconnection M3 may be formed of a metallic thin layer. The third metal interconnection M3 may be electrically connected to the second metal interconnection M2 through a bit contact 380.

A passivation layer 390 is provided on the global bit line GBL and the third metal interconnection M3.

Voids are provided between adjacent phase-changeable memory cells in the memory cell array region (for example, between adjacent phase-changeable memory cells in a row direction and between adjacent memory cells in a column direction). Here, voids may not be provided between adjacent phase-changeable memory cells in the column direction.

According to one embodiment of the present invention, voids may not be provided between two phase-changeable memory cells adjacent to the word line contact 320 (e.g., the second and third memory cells of FIG. 13). That is, voids may not be provided between the word line contact 360 and the phase-changeable memory cell adjacent to the word line contact 360. The reason is that the distance between adjacent phase-changeable memory cells (e.g., the second and third memory cells of FIG. 13) where the word line contact 360 is formed may be broader than the distance between other adjacent memory cells (e.g., the first and second memory cells of FIG. 13). Therefore, voids may not be formed. If voids are formed between phase-changeable memory cells (where the word line contact 360 is to be formed), adjacent word line contacts may be electrically connected to each other during a contact hole process for forming the word line contact 360.

After forming the device isolation layer 210 in a predetermined region of the semiconductor substrate 200 and then forming a plurality of active regions for the word lines WL, impurity ions may be implanted thereon in order to form the word lines WL. When the active regions for the word lines WL are formed in the cell array region, the active region 220 for a driving device (e.g., a MOS transistor 230) may be formed in the peripheral circuit region. For example, if the semiconductor substrate 200 is a p-type semiconductor substrate, the word line WL may be formed by implanting n-type impurity ions.

Unlike this, the word line WL may be formed using various other methods. For example, after forming a plurality of parallel epitaxial semiconductor patterns on the semiconductor substrate 200, impurity ions may be implanted thereon to form the word line WL.

After forming the word line WL, the MOS transistor 230 is formed on the active region 220 in the peripheral circuit region by using a well-known method.

After forming a contact hole that exposes the word line WL by patterning the first interlayer insulation layer 240, a semiconductor layer including germanium, silicon, or silicon-germanium is formed thereon, and an impurity is implanted. Thus, the diode 250 can be formed.

Figure 14:
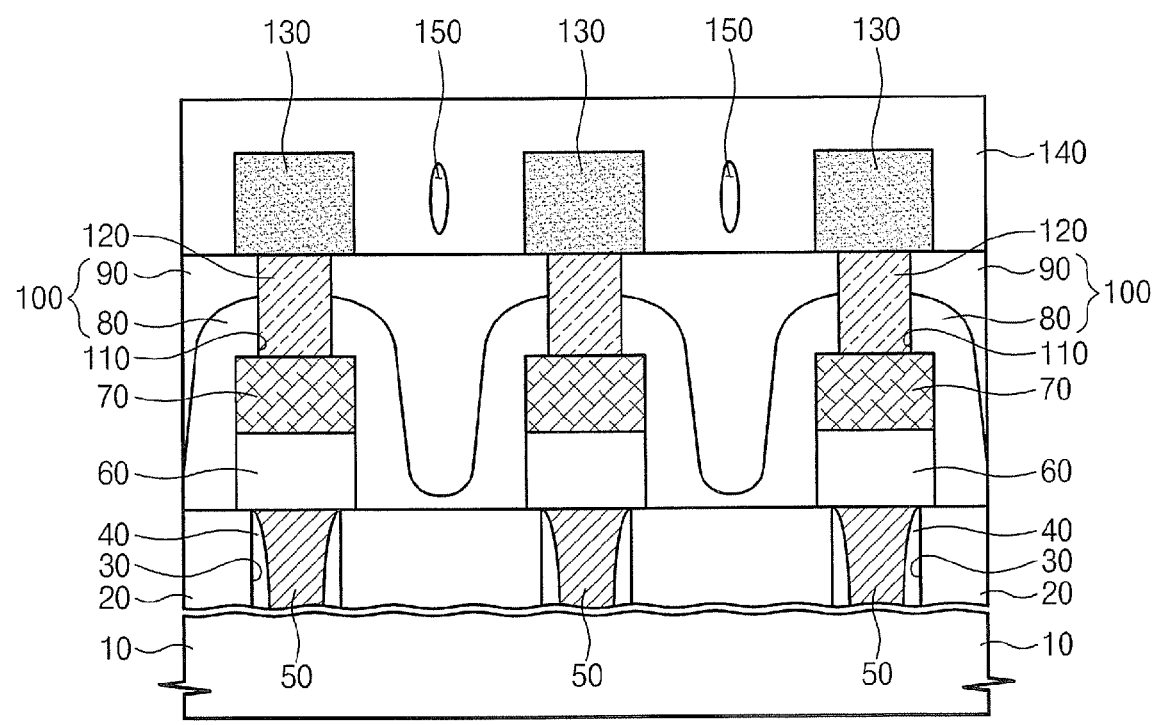
FIG. 14 is a cross-sectional view of a phase-changeable memory device according to another embodiment of the present invention.

FIG. 14 is a cross-sectional view of a phase-changeable memory device according to another embodiment of the present invention. According to this embodiment, voids may be provided between interconnections. Referring to FIG. 14, voids 150 may be provided between metal interconnections (for example, the bit lines 130). Referring to FIG. 14, a reference numeral 140 represents an insulation layer and the void 150 may be defined by the insulation layer 140.

Figure 15:
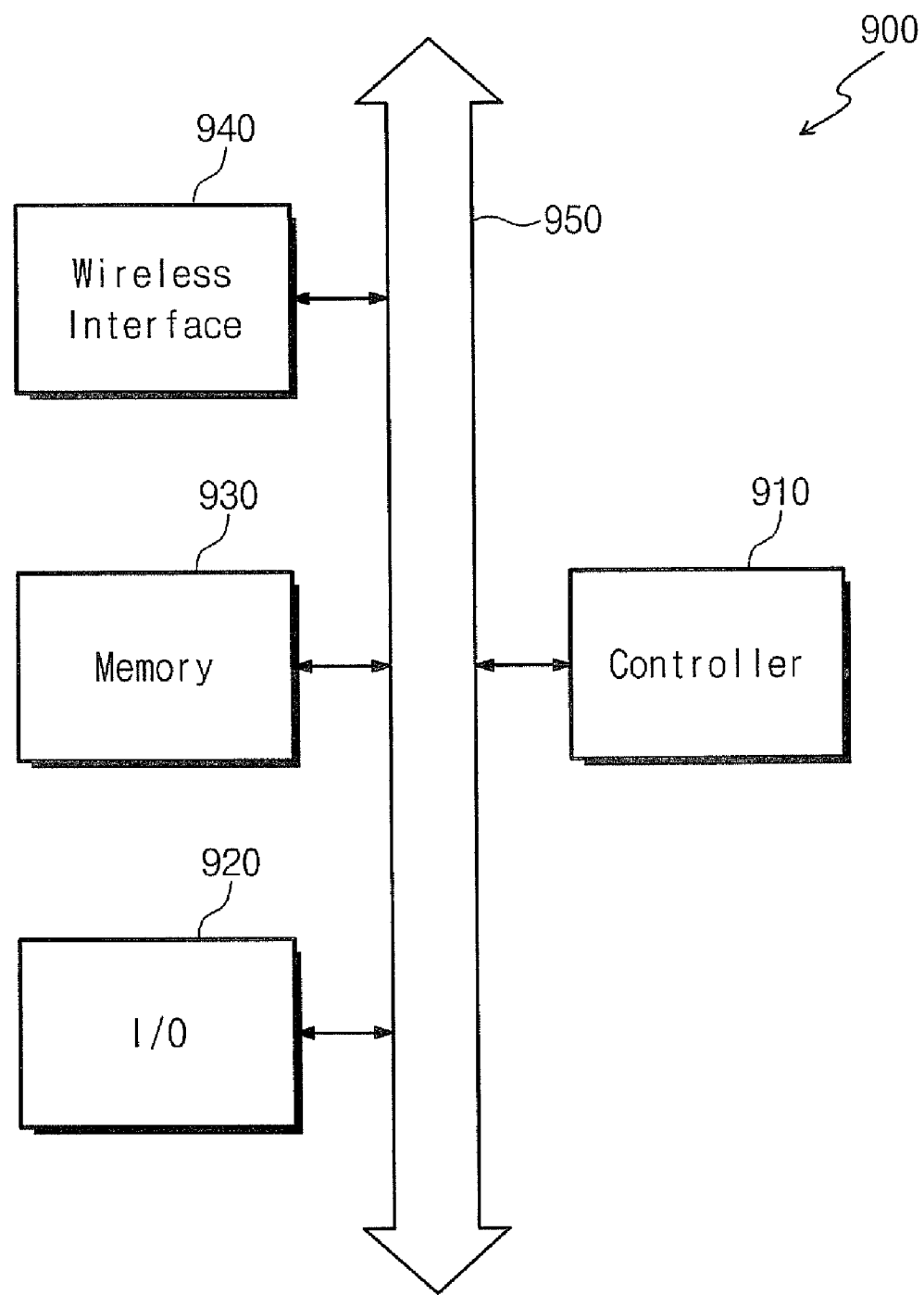
FIG. 15 is a view illustrating a system with a phase-changeable memory device according to embodiments of the present invention.

FIG. 15 is a view illustrating a system 900 with a phase-changeable memory device according to embodiments of the present invention. The system 900 may be used in wireless communication devices (e.g., a personal digital assistant (PDA), a laptop computer, a portable computer, a web tablet, a wireless telephone, a mobile phone, a digital music player) or all devices capable of transmitting/receiving information via a wireless environment.

The system 900 includes a controller 910, an input/output (I/O) device 920 (e.g., a keypad, a keyboard, and a display), a memory 930, and a wireless interface 940. The controller 910 may include at least one of a microprocessor, a digital signal processor, a microcontroller, and other like processors. The memory 930 may be used for storing commands executed by the controller 910. Additionally, the memory 930 may be used for storing user data. The memory 930 includes the phase-changeable memory according to embodiments of the present invention. The memory 930 may further include different kinds of memories, arbitrary accessible volatile memories, etc.

The system 900 may use the wireless interface 920 to transmit or receive data via a wireless communication network through an RF signal. For example, the wireless interface 940 may include an antenna and a wireless transceiver.

The system 900 according to embodiments of the present invention may be used in a communication interface protocol for the third communication systems such as Code Division Multiple Access (CDMA), Global System for Mobile Communications (GSM), North American Digital Cellular (NADC), Extended-Time Division Multiple Access (E-TDMA), and CDMA2000.

Figure 16:
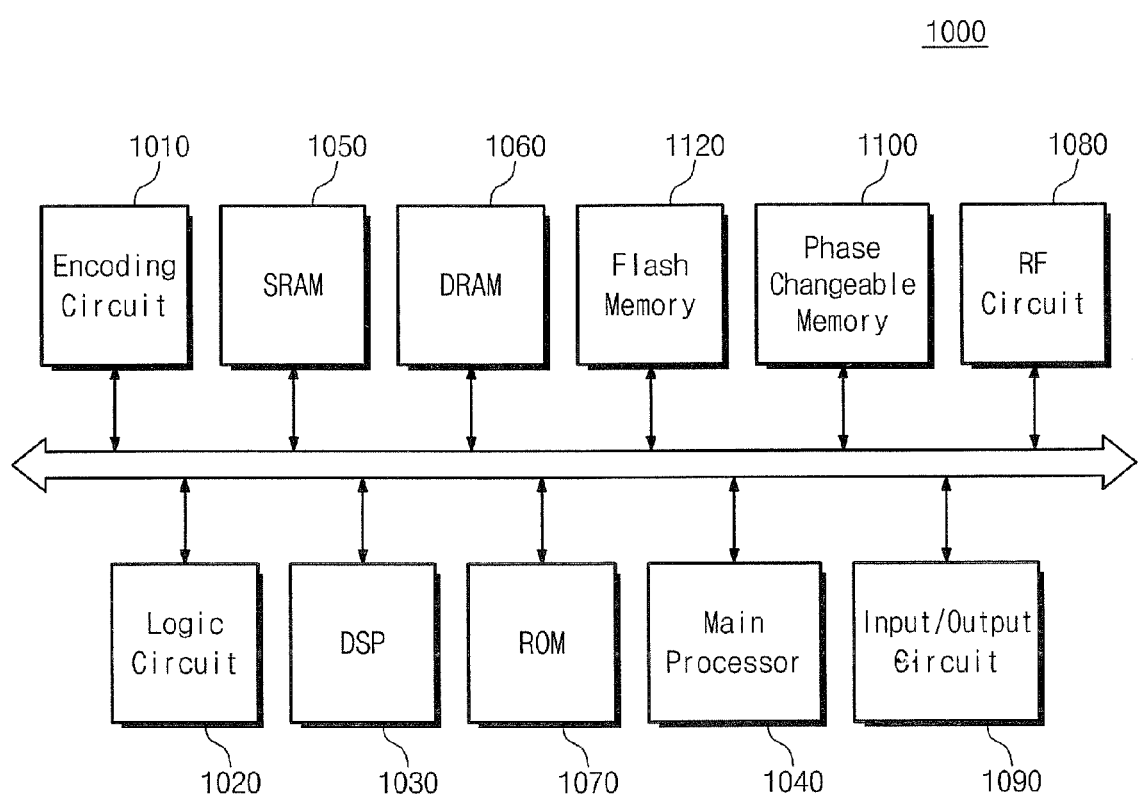
FIG. 16 is a block diagram illustrating a structure of a memory card where a phase-changeable memory device according to one embodiment of the present invention is applied.

A semiconductor device and/or a phase-changeable memory device according to embodiments of the present invention may be applied to a memory card. FIG. 16 is a block diagram illustrating a structure of a memory card 1000 where a phase-changeable memory device according to one embodiment of the present invention is applied.

Referring to FIG. 16, the memory card 1000 of the present invention includes an encryption circuit 1010 for encrypting, a logic circuit 1020, a digital signal processor (DSP) 1030 (i.e., a dedicated processor), and a main processor 1040. Additionally, the memory card 1000 includes the above-mentioned phase-changeable memory device 1100, and other various kinds of memories such as SRAM 1050, DRAM 1060, ROM 1070, and a flash memory 1120. Additionally, the memory card 1000 may include an RF (i.e., high frequency/microwave) circuit 1080 and an input/output circuit 1090. Function blocks 1010 to 1090 in the memory card 1000 may be mutually connected through a system bus.

The memory card 1000 operates according to a control of an external host (not shown), and the phase-changeable memory device of the present invention stores data or outputs the stored data according to a control of the host.

According to embodiments of the present invention, there is provided a phase-changeable memory device in order to prevent or minimize thermal interference between adjacent phase-changeable memory cells.

According to embodiments of the present invention, there is provided a reliable phase-changeable memory device with excellent properties.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit memory device, comprising:
   a non-volatile memory array having an array of phase-changeable memory elements therein that are electrically insulated from each other by at least a first electrically insulating region extending between the array of phase-changeable memory elements, said first electrically insulating region comprising:
      a silicon nitride layer covering the array of phase-changeable memory elements and directly contacting sidewalls thereof, said silicon nitride layer having an undulating surface profile with peaks and valleys thereon; and
      a silicon oxide layer on the silicon nitride layer, said silicon oxide layer extending into the valleys in the undulating surface profile and including an array of voids therein that are separated from sidewalls of the phase-changeable memory elements by said silicon oxide layer; and
      wherein each of the voids in said array of voids is located within a valley in the undulating surface profile at a position about equidistant between a corresponding pair of the phase-changeable memory elements.

2. The memory device of claim 1, wherein said non-volatile memory array comprises a two-dimensional array of phase-changeable memory elements having a plurality of rows and columns of phase-changeable memory elements therein.

3. The memory device of claim 2, wherein the array of voids is a two-dimensional array of voids.

4. The memory device of claim 3, wherein each void in the two-dimensional array of voids extends between two phase-changeable memory elements in the same row or between two phase-changeable memory elements in the same column.

5. The memory device of claim 4, wherein a plurality of voids in the array intersect with each other to thereby define a ring-shaped void surrounding a phase-changeable memory element.

6. The memory device of claim 4, wherein a plurality of voids in the array intersect with each other to thereby define a stripe-shaped void extending between a plurality of phase-changeable memory elements.

7. The memory device of claim 1, wherein a horizontal plane intersecting said array of phase-changeable memory elements extends through a plurality of voids in said array of voids.

* * * * *